(12) United States Patent
Sakata et al.

(10) Patent No.: US 6,280,207 B1
(45) Date of Patent: Aug. 28, 2001

(54) INTERMEDIATE ELECTRICAL CONNECTOR

(75) Inventors: Tsuyoshi Sakata; Takashi Nagawatari, both of Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/567,985

(22) Filed: May 10, 2000

(30) Foreign Application Priority Data

May 10, 1999 (JP) .................................... 11-127912
Sep. 24, 1999 (JP) .................................... 11-269632
Jan. 17, 2000 (JP) .................................... 12-007307

(51) Int. Cl.[7] ............................................ H01R 4/58
(52) U.S. Cl. .............................. 439/91; 439/66; 439/591
(58) Field of Search .................................. 439/91, 90, 86, 439/66, 591, 74

(56) References Cited

U.S. PATENT DOCUMENTS 5,163,834 * 11/1992 Chapin et al. .................. 439/591
5,738,530 * 4/1998 Schreiber et al. ................. 439/66
6,056,557 * 5/2000 Crotzer et al. .................... 439/66
6,210,173 * 4/2001 Matsunaga ........................ 439/66

FOREIGN PATENT DOCUMENTS

1187229 * 10/1985 (SU) ............................. 439/91

* cited by examiner

Primary Examiner—Tho D. Ta
(74) Attorney, Agent, or Firm—Kanesaka & Takeuchi

(57) ABSTRACT

An intermediate electrical connector comprises a support plate (1) which is made of a dielectric material and has at least one support aperture (2) having an inside diameter; and at least one conductive member (3) provided through the support aperture to short-circuit circuit portions of connection objects. The conductive member is made of a conductive elastomer and comprises a retention section (4) with flange portions for engage with the support aperture to attach the conductive member to the support plate; and an elastic protruded section (5). The elastic protruded section extends from the retention section in a direction of thickness of the support plate to form at opposite ends contact faces (7) for elastic contact with the circuit portions (11A, 12A) of the connection objects (11, 12) and has, adjacent to the retention section, shoulder (6) portions having an outside diameter which is smaller than the inside diameter of the support aperture.

24 Claims, 23 Drawing Sheets

INTERMEDIATE ELECTRICAL CONNECTOR

BACKGROUND OF THE INVENTION

1. Field of the Invention

The present invention relates to intermediate electrical connectors.

2. Related Art

An intermediate electrical connector is used to connect two circuit broads or corresponding circuit portions of connection objects. The intermediate electrical connector comprises a support plate of dielectric material and a conductive member extending through the support member. The conductive member is a molding of a conductive elastomer or a mixture of elastic polymeric material and conductive powder.

FIG. 1 shows an example which comprises a support member 51 of dielectric material and a conductive member 52 with upper and lower conic surfaces 52A attached thereto by integral molding. The upper and lower flat end faces 53 and 54 make elastic contact with the circuit portions of connection objects. The number of conductive members 52 provided on the support member 51 corresponds to the number of circuit portions of the connection objects.

In FIG. 2, two connection objects or circuit boards 55 and 56 are provided on both sides of the support member 51. The circuit boards 55 and 56 have circuit portions 55A and 56B which are pressed against the contact faces 53 and 54, compressing the conductive member 52. Thus, the two circuit portions 55A and 56B of the circuit boards 55 and 56 are connected to the conductive member 52 and short-circuited via the conductive member 52.

However, the above conventional intermediate electrical connector provides no satisfactory amount of elastic deformation of the conductive member 52. Since the conductive member 52 increases in diameter from the upper and lower contact faces 53 and 54 to the support member 51 and held by the edges of the support aperture 51A, not only the pressure upon the contact face 53 is distributed to the whole body but also a tension is produced on the conic surface 52 between the flange portion 52B and the contact face 53 of the conductive member 52, providing no satisfactory amount of deformation.

When a number of conductive members are molded with a support member, there are variations in their heights. In addition, the circuit boards and the support member are warped so that more variations are added to the conductive members. Moreover, when the intermediate electrical connector receives an external force, the circuit boards momentarily moves in the compression direction of the conductive member, causing poor contact of the conductive member. Consequently, it is necessary for the conductive member to provide a sufficient amount of deformation to absorb the above variations. However, the above conventional connector provides no satisfactory amount of deformation, thus causing poor contact.

The conductive elastomer has such a tendency that when compressed, its resistivity in the compression direction decreases. However, the amount of elastic deformation is so small that the contact resistance is high.

When it is compressed, the conductive elastomer decreases in electrical resistance at the initial stage but increases in electrical resistance beyond the initial stage. Thus, when it is compressed beyond the initial compression stage, the electrical characteristics deteriorates even though the mechanical contact is improved. In addition, if this high compression is applied to a number of conductive members, the combined force applied to the mating circuit boards is disadvantageously high.

When a number of conductive members are molded with a support member, their heights are not equal. In addition, the circuit boards and the support member are warped to worsen the variations in the contact points of the conductive members. Moreover, when the intermediate electrical connector receives an external force, the circuit boards are moved in the compression direction of the conductive member, causing poor contact of the conductive member. Consequently, it is necessary for the conductive member to have sufficient elasticity to absorb the above variations. However, too much elasticity causes lower electrical characteristics described above.

SUMMARY OF THE INVENTION

Accordingly, it is an object of the invention to provide an intermediate electrical connector with the conductive member having stable contact and lower contact resistance.

It is another object of the invention to provide an intermediate electrical connector with the conductive member capable of providing a large amount of deformation and stable contact and low electrical resistance without applying a high pressure.

It is still another object of the invention to provide an intermediate connector and an electrical connection system capable of providing a large amount of replacement without applying high pressure on the conductive elastomer, thereby providing good contact without increase in electrical resistance.

An intermediate electrical connector comprises a support plate which is made of a dielectric material and has at least one support aperture having an inside diameter; and at least one conductive member provided through the support aperture to short-circuit circuit portions of connection objects.

According to one aspect of the invention, the conductive member being made of a conductive elastomer and comprises a retention section with flange portions for engage with the support aperture to attach the conductive member to the support plate and an elastic protruded section.

The elastic protruded section extends from the retention section in a direction of thickness of the support plate to form at opposite ends contact faces for elastic contact with the circuit portions of the connection objects and has, adjacent to the retention section, shoulder portions having an outside diameter which is smaller than the inside diameter of the support aperture.

Since the outside diameter of the shoulder portions is smaller than the inside diameter of the support aperture, the elastic deformation of the protruded section is larger than that of the retention section; that is, the conductive member is deformed to a large extent regardless of the retention section. Thus, the circuit portions of two connection objects are short-circuited via the conductive member. The large amount of deformation in the conductive member makes the contact stable and the electrical resistance low.

Various modifications may be made to the conductive member. The conductive member has a longitudinal section which is symmetric or asymmetric relative to an axis of the conductive member. The longitudinal section of the conductive member changes in a circumferential direction. The asymmetric conductive member moves the contact point upon contact with the circuit portions of connection objects to produce the wiping or cleaning effects. Especially, the spiral configuration moves the contact points in the circumferential direction.

The protruded section has a cylindrical or conic surface. The faces each have a flat, convex, concave, or tilted surface at right angles to the axis. It preferred in some cases that the shoulder portions are rounded as a countermeasure for fatigue.

According to another aspect of the invention, the conductive member being made of a conductive elastomer and comprises a retention section for engagement with the support plate; an elastic protruded section extending from the retention section in a direction of thickness of the support plate to form at opposite ends bearing faces for elastic contact with the circuit portions of the connection objects; and a displacement cavity to allow the protruded section to undergo elastic displacement in the direction of pressure.

The protruded section undergoes elastic compression and deformation under the contact pressure of a connection object and moved into the displacement cavity. The bearing face moves by the sum of the compression deformation and the displacement of the protruded section so that a large amount of movement is secured by a small amount of compression.

The displacement means is a space made between a face opposite to the bearing face and a connection object, or a cavity made within the conductive member. The cavity may be any number of and size of gaps or spaces within the conductive member. The conductive member may be made of foam rubber.

The conductive member is held by the edges of aperture or a bridge extending across an aperture provided in the support plate. In the latter case, the conductive member may made asymmetric to tilt, thereby increasing the amount of movement.

According to still another aspect of the invention, at least one of the contact faces has at least first and second contact sections which make successive contacts with one of the circuit portions of the connection objects. When it receives contact pressures between connection objects, the conductive member are elastically compressed and short-circuit the circuit portions of the connection objects. When compressed, the conductive member decreases in electrical resistance at the initial stage but increases beyond the initial stage. According to the invention, when the amount of compression increases, the second contact section makes contact to increase the entire contact area thereby reducing the electrical resistance. Thus, the electrical resistance is kept low for large amounts of compression. In addition, the initial contact area is so small that the compression force is small.

According to embodiments of the invention, the first contact section is substantially parallel to the circuit portion of the connection object while the second contact section is provided closer to the support plate than the first contact section. The first contact section is provided at a center of the contact face while the second contact section is provided around the first contact section, or the first contact section is provided at a periphery of the contact face while the second contact section is provided at a center of the contact face. The first contact section is provided at a portion of periphery while the second contact section is provided adjacent to the first contact section, or the first contact section extends radially on the contact face while the second contact section is provided at a remaining area of the contact face.

The contact face has a generally concave surface to match a convex surface of the circuit portion of the connection object, the concave surface having a raised portion to form the first contact section and a remaining portion to form the second contact section. The first contact section is parallel to the circuit portion of the connection object while the second contact section is tilted with respect to the first contact section. The first and second contact sections are provided on circuit portions of a pair of connection objects to provide an electrical connection system. A conductive member provided on the electric circuit of a support plate for contact with a circuit portion of a connection object to short-circuit the electric circuit to the circuit portion of the connection object.

PREFERRED EMBODIMENTS OF THE INVENTION

Embodiments of the invention will now be described with reference to FIGS. 3–28.

Figure 3:
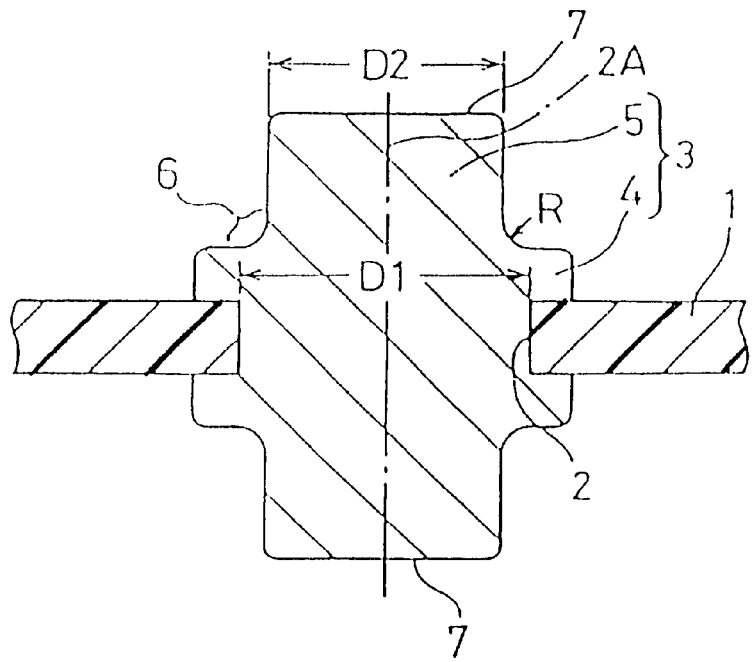
FIGS. 3 and 4 are sectional views of a conductive member according to an embodiment of the invention before and after deformation, respectively.

In FIG. 3, a support plate 1 is made of dielectric material. A plurality of support apertures 2 having an inside diameter D1 are provided in the support plate 1, and a plurality of conductive members 3 are attached thereto by integral molding such that each conductive member 3 is held by the circumferential edges of each support aperture 2. Preferred examples of the dielectric material include films of polyimide, polyester, and polyamide.

The conductive member 3 is made by mixing an elastic polymeric material with a conductive powder or particles. Preferred examples of the elastic polymers are silicone rubber, polybutadiene rubber, natural rubber, polyisoprene, styrene-butadiene copolymer rubber, acrylonitrile-butadiene copolymer rubber, ethylene-propylene copolymer rubber, urethane rubber, polyester rubbers, chloroprene rubber, epichlorohydrin rubber, and soft liquid epoxy rubber. Examples of the conductive powder or particles mixed with the elastic polymeric material include one or more of powder, granules, chips, flakes, and amorphous materials of gold, silver, nickel, copper, tin, aluminum, palladium, and carbon. Especially, flakes of silver are preferred. It is preferred that silver powder is treated with an organic silicon compound.

The conductive member 3 has a retention section 4 and an elastic protruded section 5. The retention section 4 is brought into contact with the inside wall of the support aperture 2 and the upper and lower surfaces of the support plate 1 so as to cover the edges of the support aperture 2 of the inside diameter D1. The protruded section 5 has shoulder portions 6 next to the retention section 4 and takes a cylindrical form having an outside diameter D2 and flat contact faces 7 at opposite ends. The outside diameter D2 is smaller than the inside diameter D1 of the support aperture 2 so that the protruded section 5 is situated within radial range of their support aperture 2. The shoulder portions 6 are rounded as shown by R in the figure.

The intermediate electrical connector operates as follows.

Figure 4:
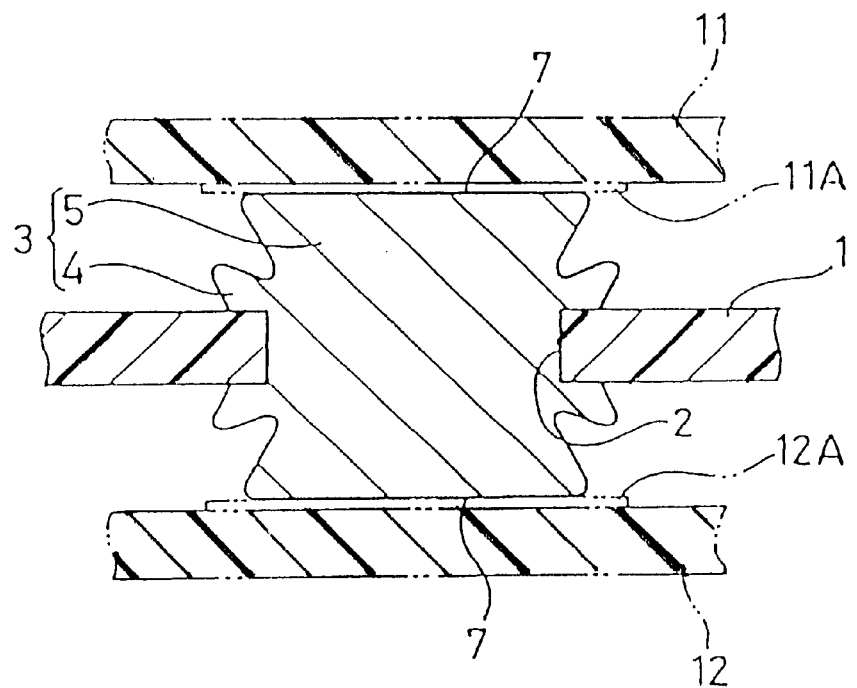

In FIG. 4, a pair of connection objects or circuit boards 11 and 12 are provided on both sides of the support plate 1 and fixed at predetermined positions by proper means. The circuit boards 11 and 12 have circuit portions 11A and 12A, respectively, which are pressed against the contact faces 7 of the conductive member 3 when the circuit boards 11 and 12 are situated at the predetermined positions.

Since the elastic protruded section 5 is situated within the radial range of the support aperture 2, it is able to undergo large elastic deformation in the vertical direction regardless of the presence of the retention section 4. The amount of elastic deformation of the protruded section 5 is sufficiently large to absorb variations of the conductive members 3 and the circuit boards 11 and 12, thus ensuring good contacts of the conductive members 3 under satisfactory contact pressure. In addition, the large amount of compression of the conductive members 3 reduces the electrical resistance.

Various modifications will be described below.

Figure 5:
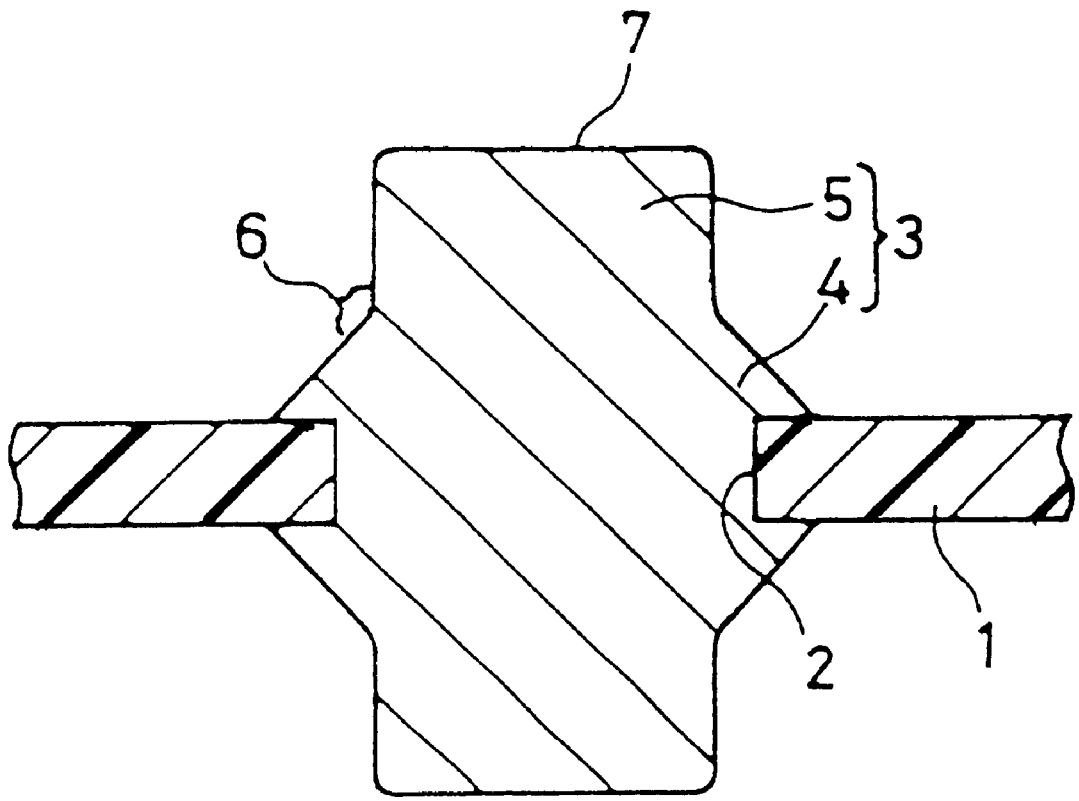
FIG. 5 is a sectional view of a modified conductive member according to another embodiment of the invention.

In FIG. 5, the shoulder portions 6 are formed with tilted surfaces.

Figure 6:
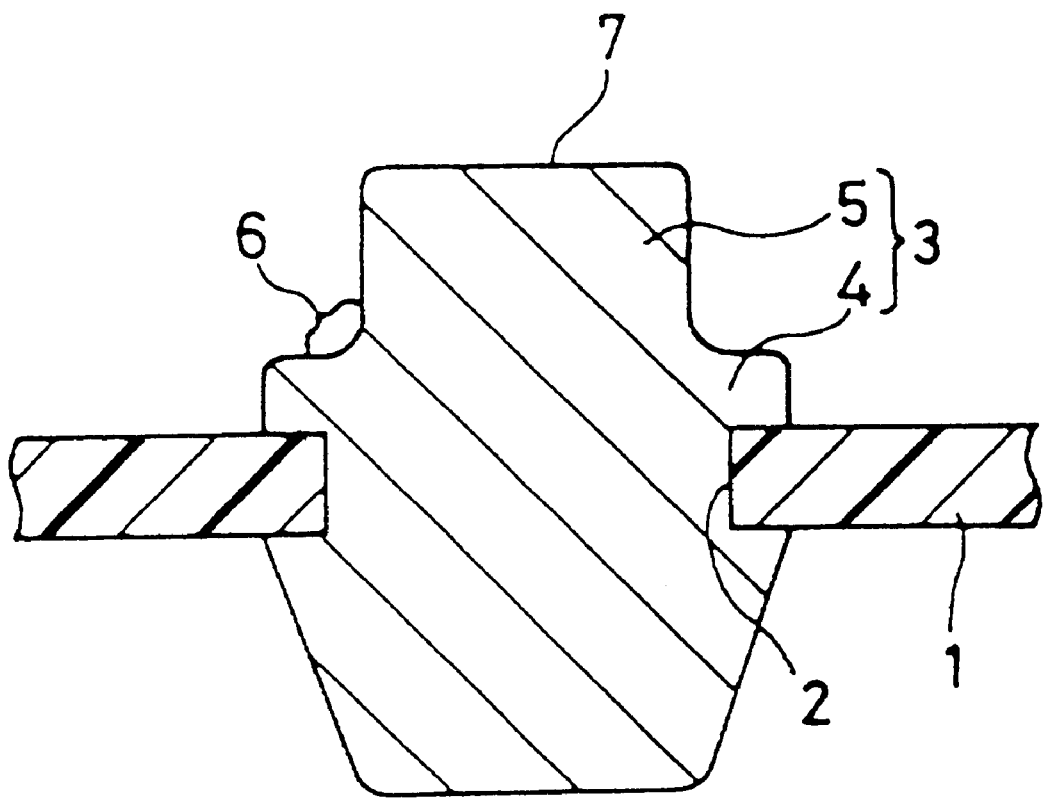
FIG. 6 is a sectional view of a modified conductive member according to still another embodiment of the invention.

In FIG. 6, one shoulder portion 6 is provided on one of the sides and a conic section is provided on the other side to produce the same effects on the side where the shoulder portion is provided.

Figure 7:
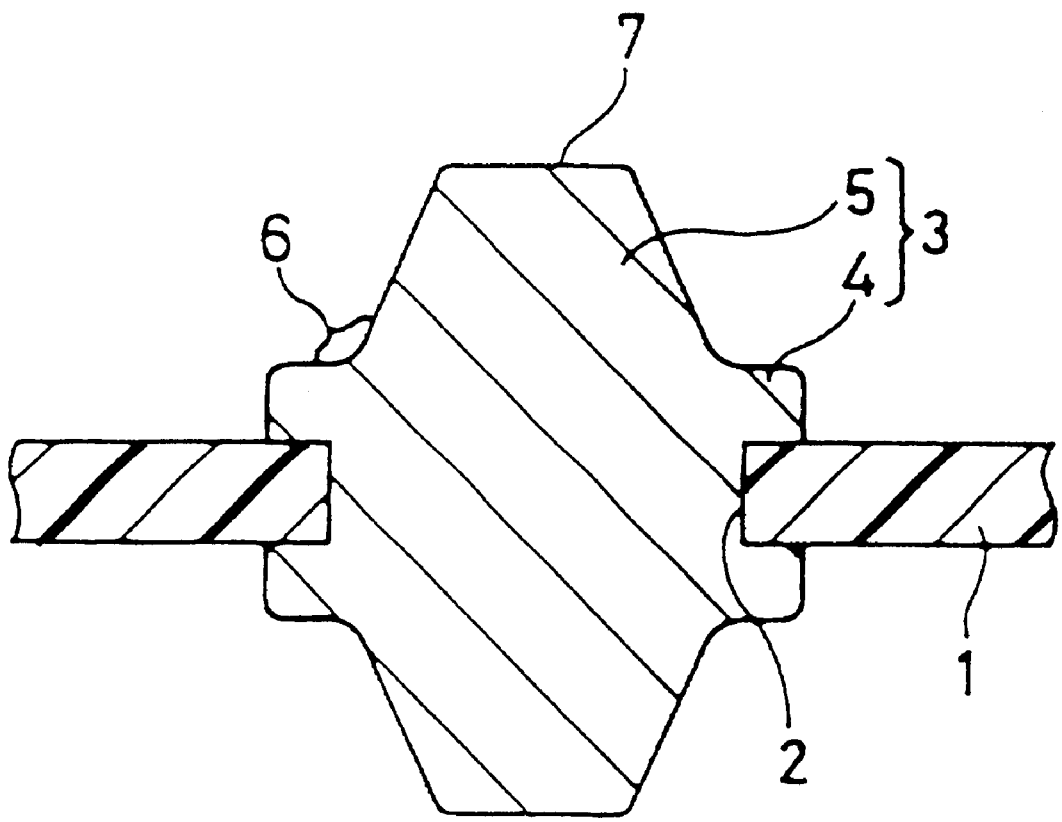
FIG. 7 is a sectional view of a modified conductive member according to yet another embodiment of the invention.

In FIG. 7, the protruded section 5 takes a pair of upward and downward conic shapes with shoulder portions 6 next to the retention section 4.

Figure 1:
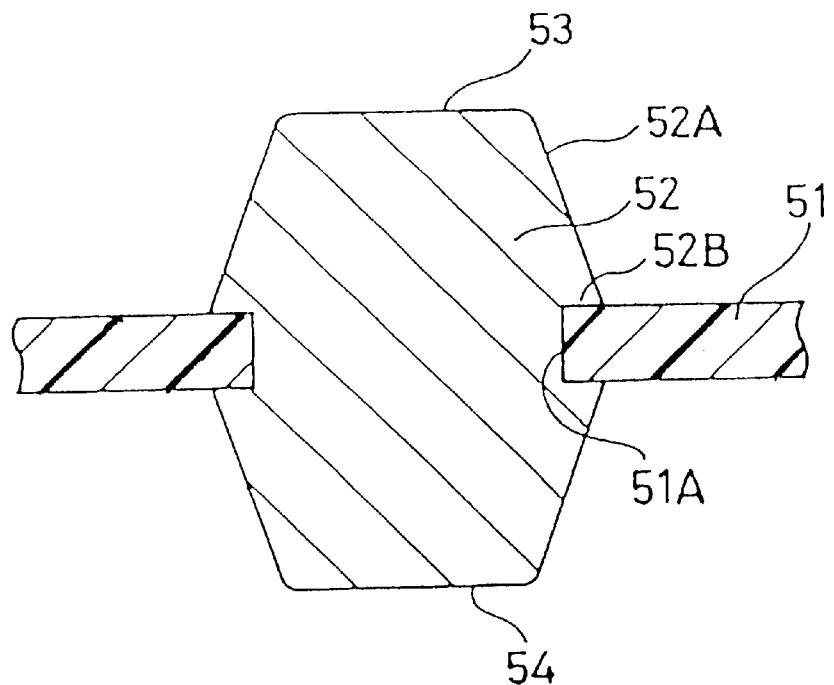
FIGS. 1 and 2 are sectional views of a conventional conductive member before and after deformation, respectively.
Figure 2:
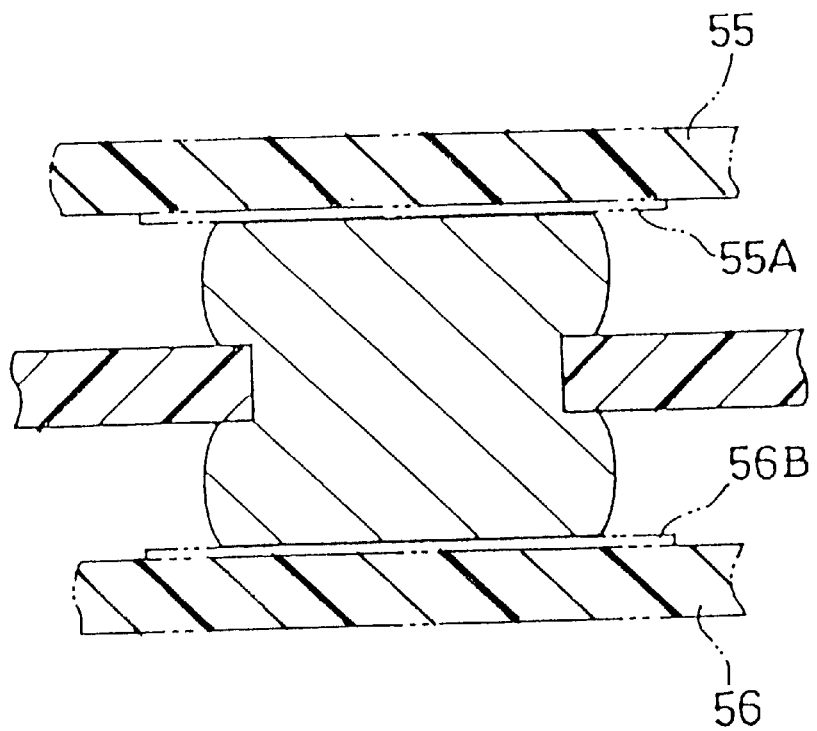
Figure 8:
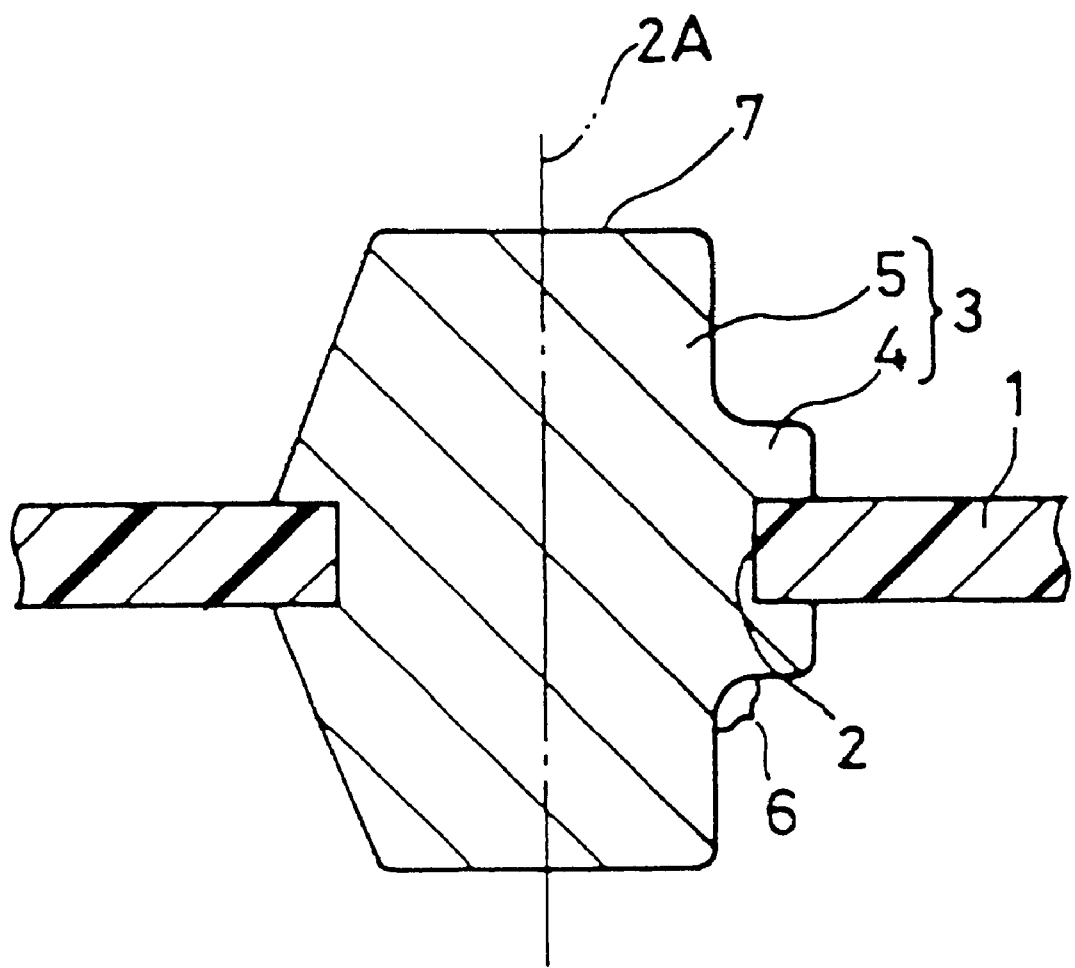
FIG. 8 is a sectional view of a modified conductive member according to another embodiment of the invention.

In FIG. 8, the shape on the right side of an axis 2A is identical with the shape of FIG. 1 and the left side with the shape of FIG. 1 to produce a large amount of elastic deformation on the right side so that the conductive member 7 slide laterally relative to the circuit boards, producing the wiping effects.

Figure 9:
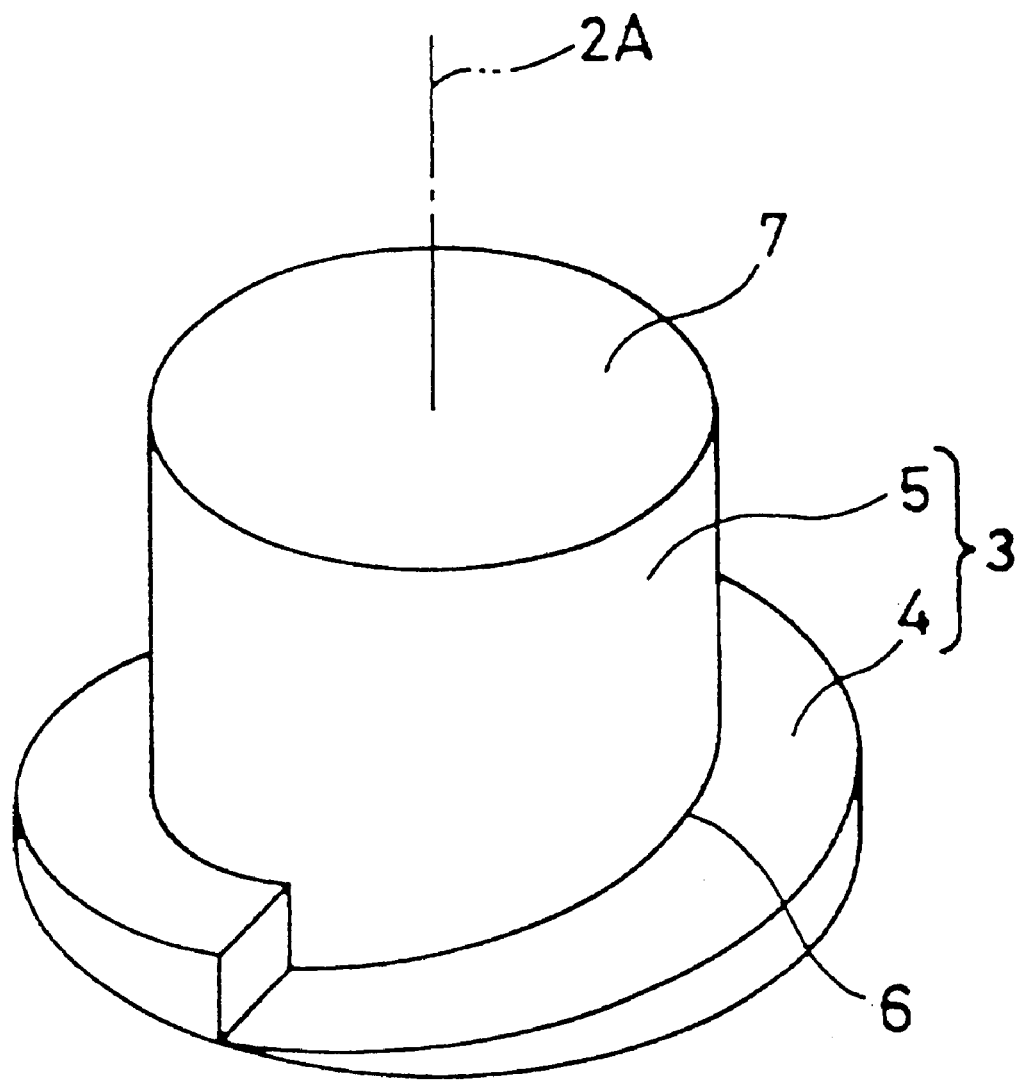
FIG. 9 is a sectional view of a modified conductive member according to still another embodiment of the invention.

In FIG. 9, the thickness of the retention section 4 changes in spiral manner to allow a large amount of elastic deformation of the protruded section 5 and produce twisting movement around the axis 2A, thereby producing the wiping effects relative to the circuit boards.

Figure 10:
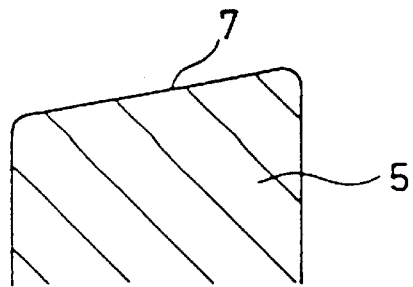
FIGS. 10–13 are sectional views of a contact face according to various embodiments of the invention.

In FIG. 10, the contact face 7 is tilted to produce the wiping effects.

Figure 11:
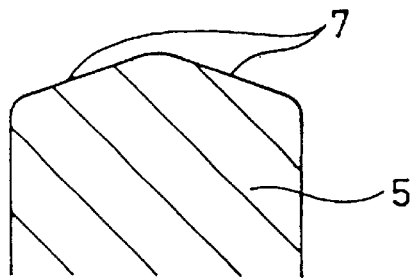

In FIG. 11, the contact face 7 has a conical surface to reduce the contact area with a mating object, which is prone to corrosion, so as to increase the Hertz stress and ensure the contact stability.

Figure 12:
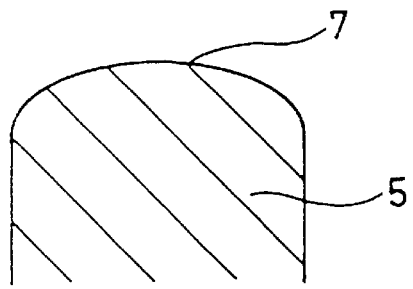

These effects also are produced by a convex curved surface 7 as shown in FIG. 12.

Figure 13:
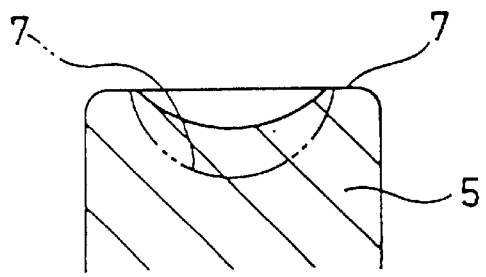

In FIG. 13, a concave surface 7 is provided on the contact area to produce the suction effects, thereby assuring firm contact. The depth of the concave surface 7 is determined to match the solder ball or the like of a mating object as shown by phantom line. If the contact surface is provided with many fine projections, the wiping effects are produced at random.

As has been described above, according to one aspect of the invention, the conductive member is made of conductive elastomer so as to have a retention section for engagement with the edges of a support aperture of a support plate and an elastic protruded section extending from the retention section in the direction of thickness of the support plate. The retention section has flange portions extending in the radial direction of the support aperture. The elastic protruded section has a pair of contact portions for elastic contact with the circuit portions of connection objects. There are provided shoulder portions between the protruded section and the retention section. The diameter of the shoulder portions is smaller than the diameter of the support aperture so that upon contact with connection objects, the elastic protruded section is able to undergo large elastic deformation regardless of the presence of the retention section, thereby providing a sufficient amount of deformation to absorb variations of the conductive members and connection objects to thereby ensure stable connections. In addition, the large amount of compression reduces the contact resistance of the conductive members, thereby providing good electrical connections.

Figure 14:
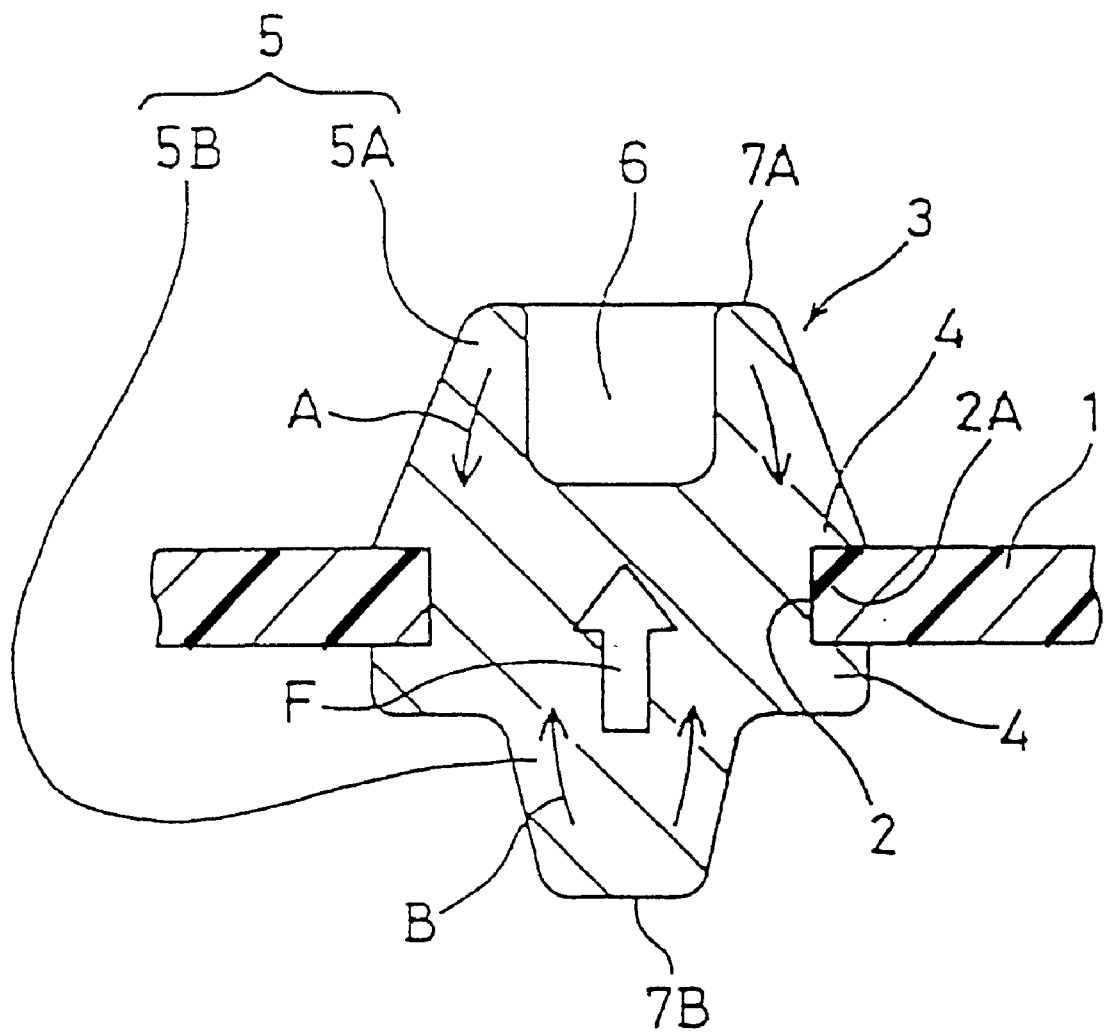
FIG. 14 is a sectional view of a conductive member according to an embodiment of the invention.

In FIG. 14, a support plate 1 is made of dielectric material. A plurality of support apertures 2 having an inside diameter D1 are provided in the support plate 1, and a plurality of conductive members 3 are attached thereto by integral molding such that each conductive member 3 is held by the circumferential edges 2A of each support aperture 2. Preferred examples of the dielectric material include films of polyimide, polyester, and polyamide.

The conductive member 3 is made by mixing elastic polymeric material with conductive powder or particles.

Preferred examples of the elastic polymers are silicone rubber, polybutadiene rubber, natural rubber, polyisoprene, styrene-butadiene copolymer rubber, acrylonitrile-butadiene copolymer rubber, ethylene-propylene copolymer rubber, urethane rubber, polyester rubbers, chloroprene rubber, epichlorohydrin rubber, and soft liquid epoxy rubber.

Examples of the conductive powder or particles mixed with the elastic polymeric material include one or more of powder, granules, chips, flakes, and amorphous materials of gold, silver, nickel, copper, tin, aluminum, palladium, and carbon. Especially, flakes of silver are preferred. It is preferred that silver powder is treated with an organic silicon compound.

The conductive member 3 has a retention section 4 and an elastic protruded section 5. The retention section 4 is brought into contact with the inside wall of the support aperture 2 and the upper and lower surfaces of the support plate 1 so as to cover the edges 2A of the support aperture 2. The conductive member 3 is integrally molded with the support member 1. The protruded section 5 has upward and downward extending sections 5A and 5B. The upward extending section 5A has a conic side and a displacement means or recess 6 at the top surface, forming an annular bearing face 7A.

The downward extending section 5B has a conic side having an outside diameter smaller than the outside diameter of the upward extending section 5A but substantially equal to the inside diameter of the displacement recess 6 and is situated at a position corresponding to the displacement recess 6. Also, it has a circular bearing face 7B having a diameter substantially equal to the inside diameter of the displacement recess 6.

The intermediate electrical connector operates as follows.

In FIG. 14, a pair of connection objects or circuit boards are provided on both sides of the support plate 1 and fixed at predetermined positions by proper means. The circuit boards have circuit portions, respectively, which are pressed against the bearing faces 7A and 7B of the conductive member 3 when the circuit boards are situated at the predetermined positions.

The upward extending section 5A is compressed in the direction of an arrow A by the pressure on the bearing face 7A while the downward extending section 5B is compressed in the direction of an arrow B by the pressure on the bearing face 7B and is displaced into the displacement recess 6 indicated by an arrow F. Consequently, the downward extending section 5B is moved by the sum of the compressed length and displaced distance. Thus, even if the compressed length is small, the total amount of movement is large. The contact pressure is smaller than the contact pressure under which the conventional conductive member is moved by the same amount.

The amount of movement of the elastic protruded section 5 is so large that even if there are variations between the bearing faces 7A and 7B of a number of conductive members 3 and the circuit portions of connection objects, such variations are absorbed satisfactorily. Consequently, under light contact pressures, good contacts are ensured for all of the conductive members 3. The compression of the conductive members 3 is so small that the electrical resistance is low, improving the electrical characteristics.

Various modifications will be described below.

Figure 15:
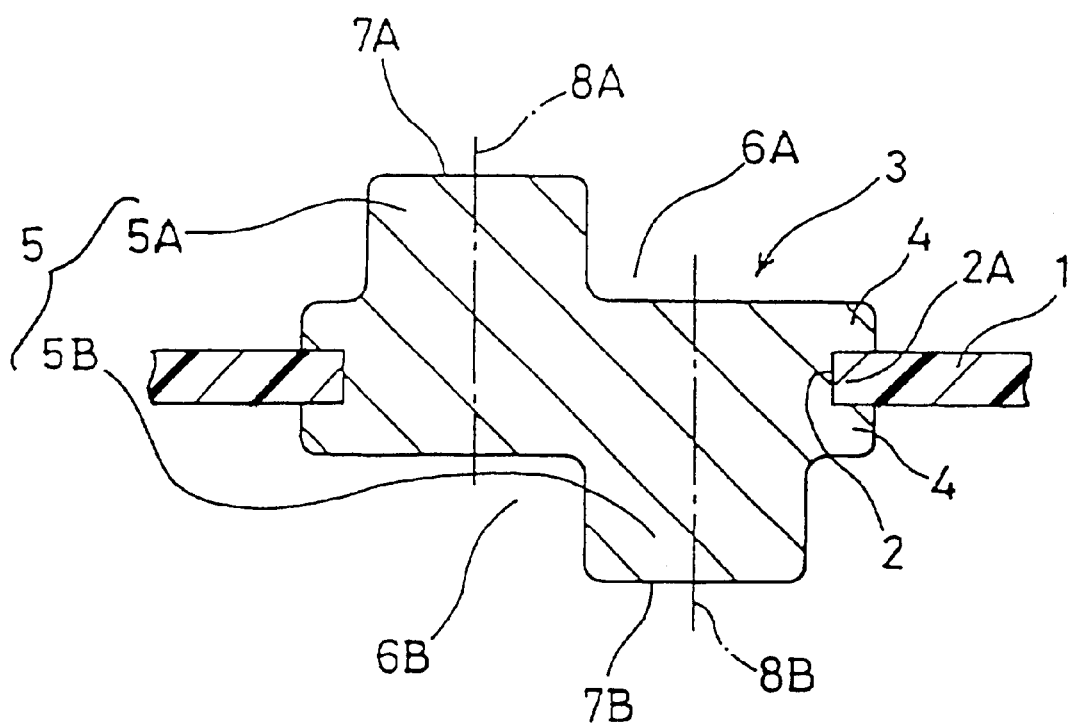
FIG. 15 is a sectional view of a modified conductive member according to another embodiment of the invention.

In FIG. 15, the upward and downward extending sections 5A and 5B have the same cylindrical side, but their central axes 8A and 8B are offset to form displacement means or spaces 6A and 6B on opposite sides to the bearing faces 7A and 7B, respectively. In addition to the movement of the upward and downward extending sections 5A and 5B, the conductive member 3 is tilted because of its asymmetric shape, increasing the amount of movement.

Figure 16:
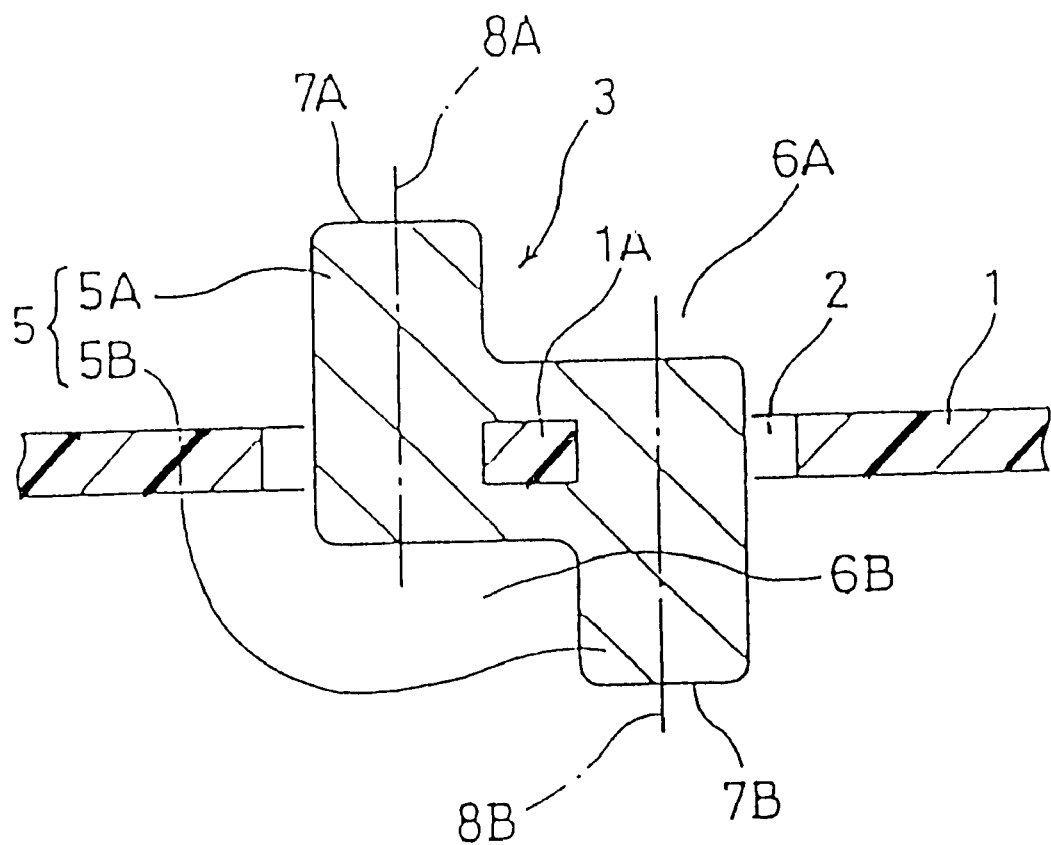
FIG. 16 is a sectional view of a modified conductive member according to still another embodiment of the invention.

In FIG. 16, the conductive member 3 is held by the central portion in contrast to the above modification wherein the conductive member 3 is held by engagement between the retention flanges 4 and the edges of a support aperture 2.

The inside diameter of the support aperture 2 is larger than the outside diameter of the conductive member 3. A bridge portion 1A diametrically extends across the support aperture 2. The conductive member 3 is spaced from the side face of the support aperture 2 and held by the bridge portion 1A. Since the circumferential face of the conductive member 3 is not fixed, it is easy for the conductive member 3 to tilt, thus increasing the amount of movement.

Figure 17:
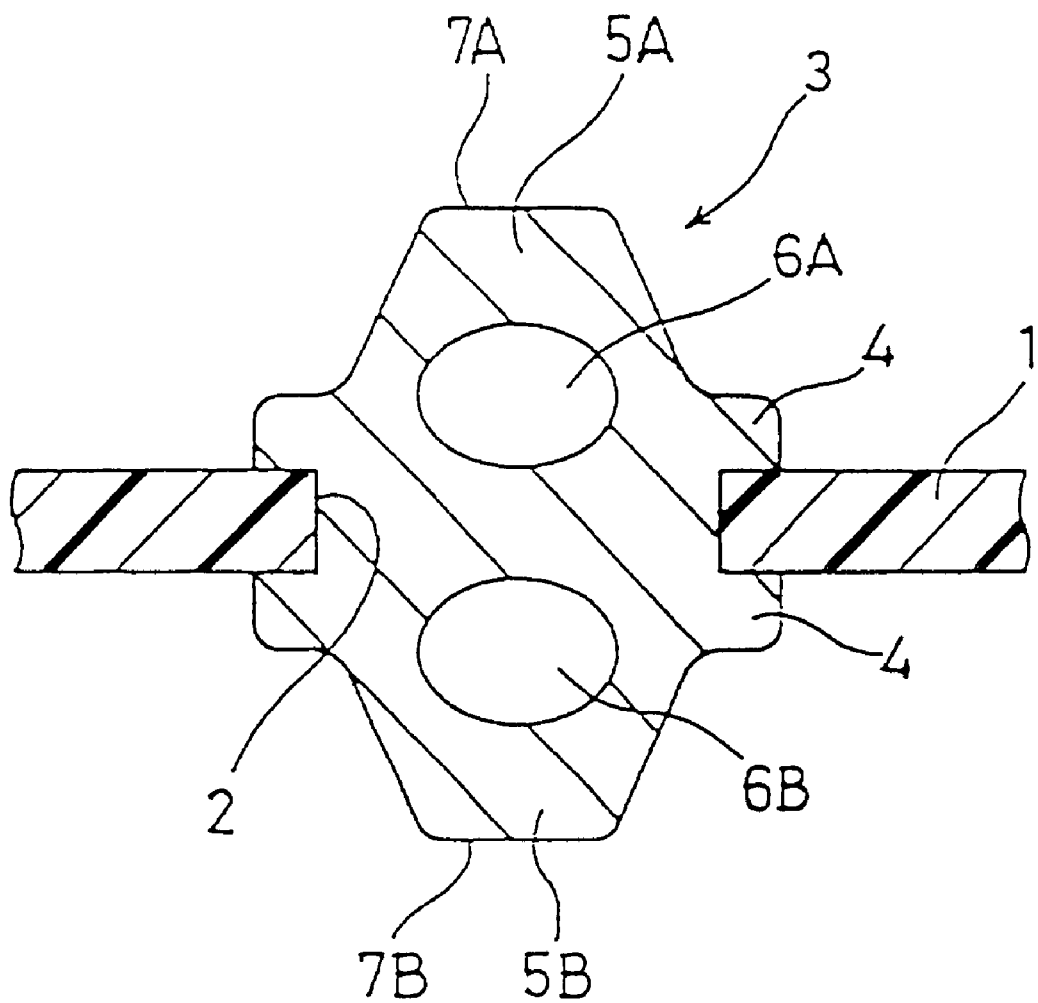
FIG. 17 is a sectional view of a modified conductive member according to yet another embodiment of the invention.

In FIG. 17, a pair of displacement means or cavities 6A and 6B are provided within the conductive member 3. Any number and/or size of the displacement cavities may be provided as far as it is effective for the elastic protruded sections to move. That is, the elastic protruded sections may be made of foam rubber to produce the effects.

As has been described above, according to another aspect of the invention, the conductive member is made of conductive elastomer so as to have a retention section for engagement with a support plate and an elastic protruded section extending from the retention section in the direction of thickness of the support plate. A displacement means is provided in the conductive member to allow the elastic protruded section to displace so that the bearing face of the protruded section can move to a large extent, thereby providing a sufficient amount of movement to absorb variations in relative positions between the conductive members and connection objects or momentary movement of connection objects, ensuring a stable contact. Since the amount of compression is limited to the proper level, the conductive member maintains the low contact resistance, ensuring the good electrical characteristics.

Figure 18:
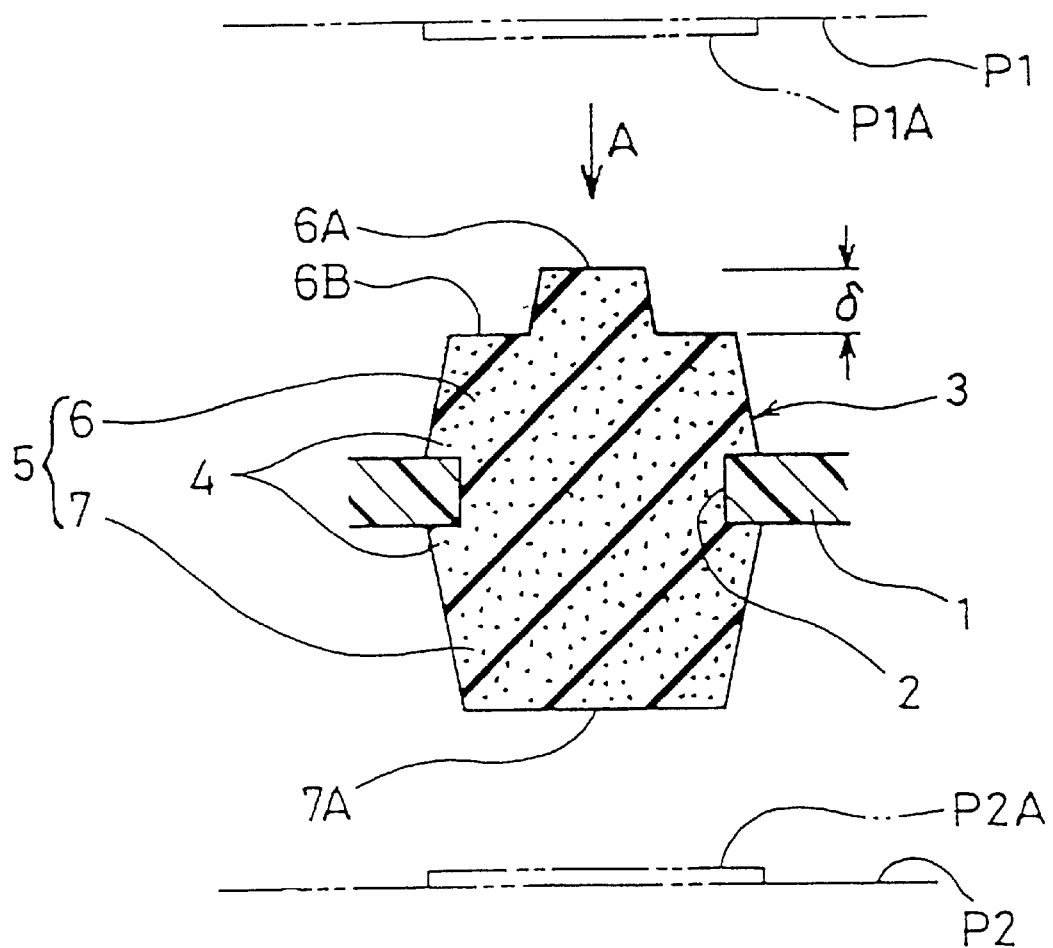
FIG. 18 is a sectional view of a conductive member according to an embodiment of the invention.

In FIG. 18, a support plate 1 is made of dielectric material. A plurality of support apertures 2 are provided in the support plate 1, and a plurality of conductive members 3 are attached thereto by integral molding. Preferred examples of the dielectric material are films of polyimide, polyester, and polyamide.

The conductive member 3 is made of mixing elastic polymeric material with conductive powder or particles. Preferred examples of the elastic polymers are silicone rubber, polybutadiene rubber, natural rubber, polyisoprene, styrene-butadiene copolymer rubber, acrylonitrile-butadiene copolymer rubber, ethylene-propylene copolymer rubber, urethane rubber, polyester rubbers, chloroprene rubber, epichlorohydrin rubber, and soft liquid epoxy rubber.

Examples of the conductive powder or particles mixed with the elastic polymeric material include one or more of powder, granules, chips, flakes, and amorphous materials of gold, silver, nickel, copper, tin, aluminum, palladium, and carbon. Especially, flakes of silver are preferred. It is preferred that silver powder is treated with an organic silicon compound.

The conductive member 3 has retention sections 4 and elastic protruded sections 5. The retention sections 4 are brought into contact with the inside wall of the support aperture 2 and the upper and lower surfaces of the support plate 1 so as to cover the edges of the support aperture 2. Such a retention structure is obtained by integrally molding the conductive members 3 with the support plate 1. The protruded sections 5 consists of upper and lower conic sections 6 and 7.

The lower conic section 7 has a pedestal section with a lower flat contact face 7A while, according to the invention, the upper conic section 6 has a double pedestal sections with first and second contact faces 6A and 6B. The first and second contact faces 6A have a flat surface, respectively, to match the flat circuit portions P1A and P2A of circuit boards P1 and P2, respectively, but may have a curbed or tilted surface. According to the invention, one of the upper and lower conic sections has a plurality of contact surfaces which are made in the form of a step.

The distance δ between the first and second contact faces 6A and 6B is determined by the amount of compression caused by the circuit boards or connection objects.

When the conductive member 3 is compressed by the upper circuit board P1, the first contact face 6A receives the pressure for compression up to the distance δ, where the second contact face 6B starts contact for compression. The δ is determined at such a point that the electrical resistance of the conductive member 3 starts to rise under the conditions that only the first contact face 6A receives the compression.

The intermediate connector operates as follows.

In FIG. 18, a pair of connection objects or circuit boards P1 and P2 are provided and fixed by proper means on upper and lower sides of the support plate 1 so as to compress the conductor member 3. The circuit boards P1 and P2 have a circuit portion P1A or P2A, respectively, so that when they are fixed at the predetermined positions, the circuit portions P1A and P2A press the contact faces 6A, 6B, and 7A of the conductive member 3, respectively.

The first contact face 6A receives the pressure from the circuit board P1 so that the upper protruded section 6 is compressed in the direction of an arrow A. The electrical resistance decreases in the initial stage but starts to increase when the amount of compression reechoes the value δ. When the conductive member 3 is further compressed, the second contact face 6B is brought into contact with the connection object P1 so that the contact area increases so much that the electrical resistance decreases. The position of the connection object P1 is determined at a position where the amount of compression is set before the electrical resistance increases after the initial decrease.

The contact face 7A of the lower protruded section 7 is brought into contact with the lower connection object P2 under a predetermined contact pressure. Thus, the circuit portions P1A and P2A of the connection objects P1 and P2 are connected to each other with a low electrical resistance and a large amount of movement because of the first and second contact faces 6A and 6B of the upper protruded section. Consequently, variations in the contact positions due to variations in the circuit component positions, warp of the support plate, and dimensions of the conductive member are absorbed satisfactorily while the good electrical characteristics are maintained. The lower protruded section 7 may be made so as to have the same structure as the upper protruded section 6.

Various modifications will be described below.

Figure 19:
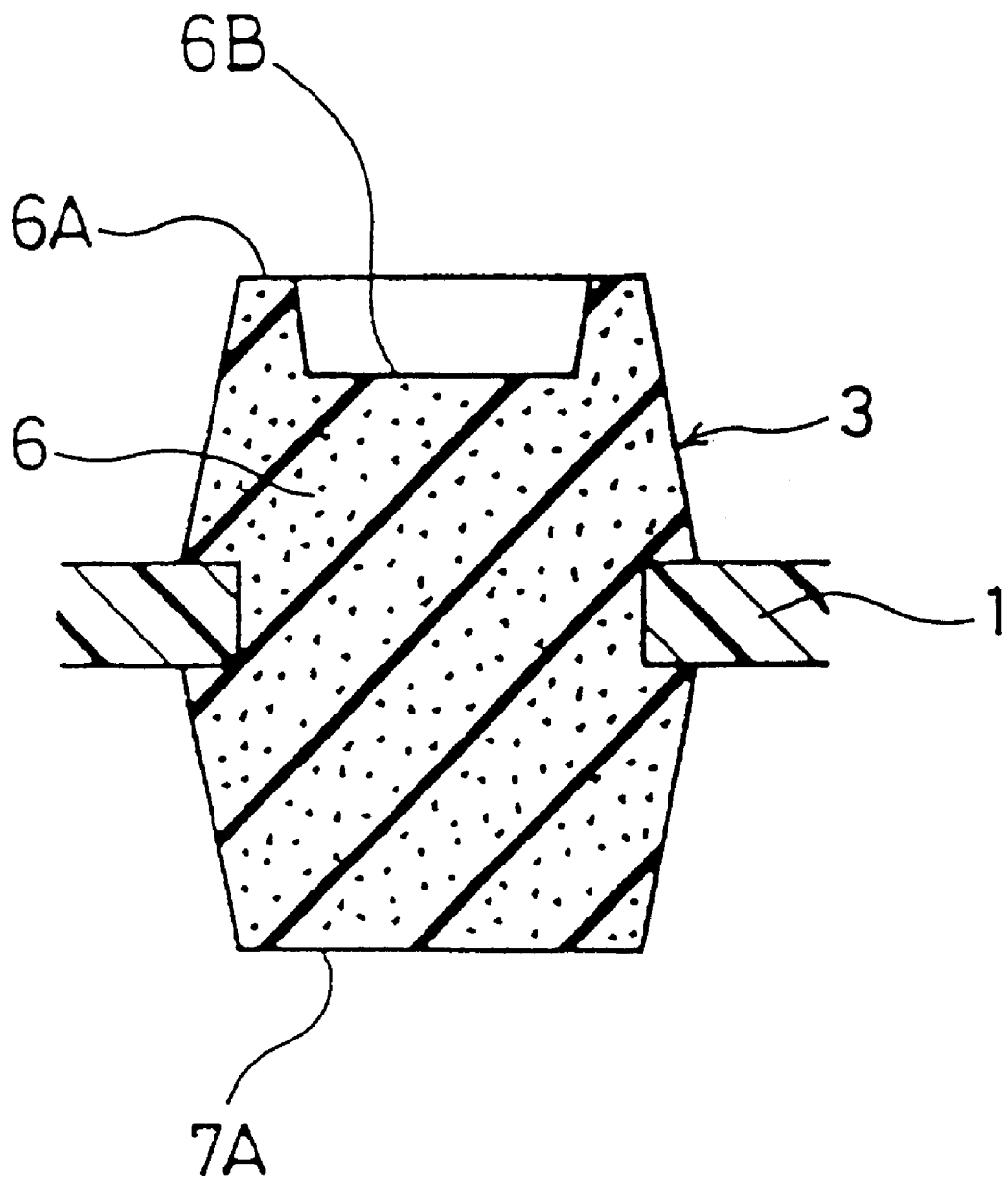
FIG. 19 is a sectional view of a conductive member according to another embodiment of the invention.

In FIG. 19, a recess is provided at the center of a top face so as to form first and second contact faces 6A and 6B. The area ratio and the distance between the contact faces 6A and 6B are determined such that the second contact face starts to contact the connection object when the electrical resistance at the first contact face 6A starts to increase with increase of the compression.

Figure 20:
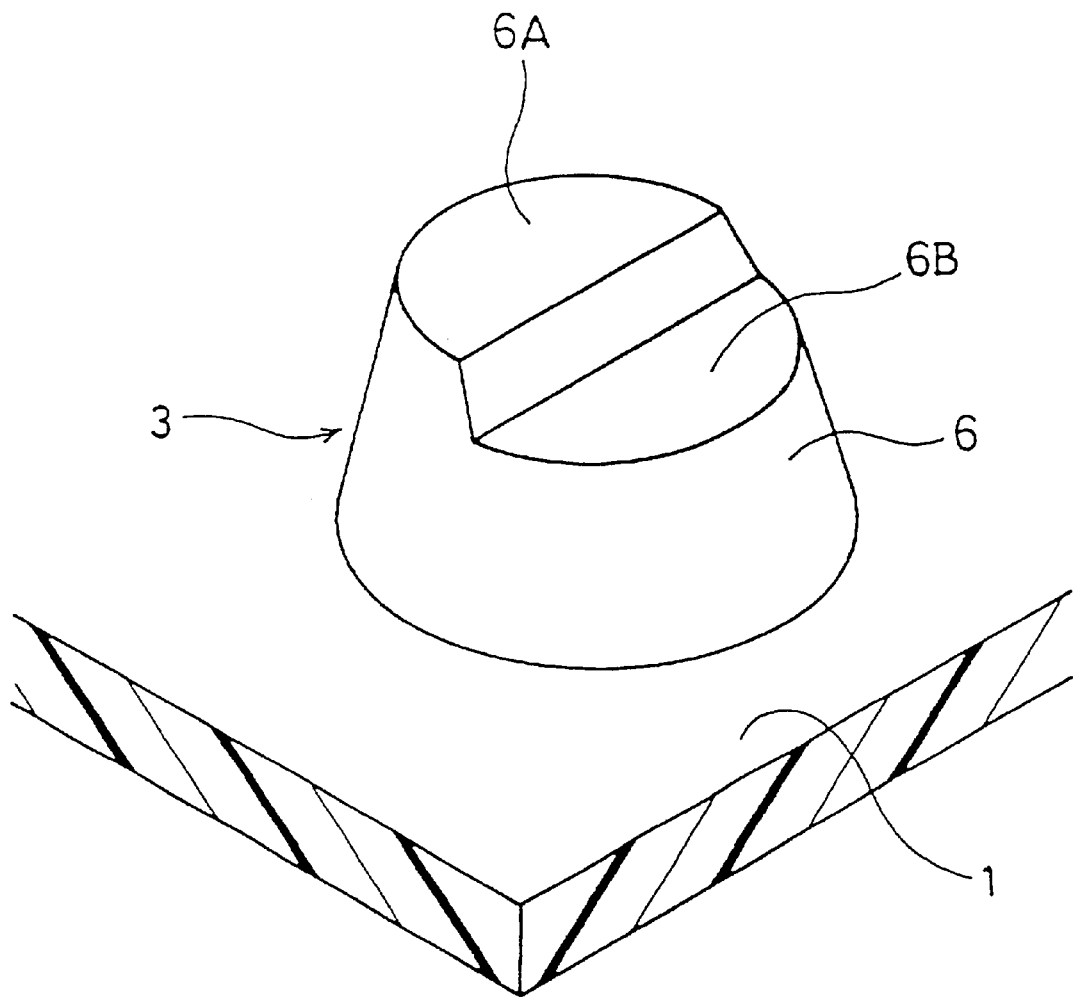
FIG. 20 is a perspective view of a conductive member according to still another embodiment of the invention.

In FIG. 20, the top face of the upper protruded section 6 is divided into first and second contact faces 6A and 6B by a diametric line.

Figure 21:
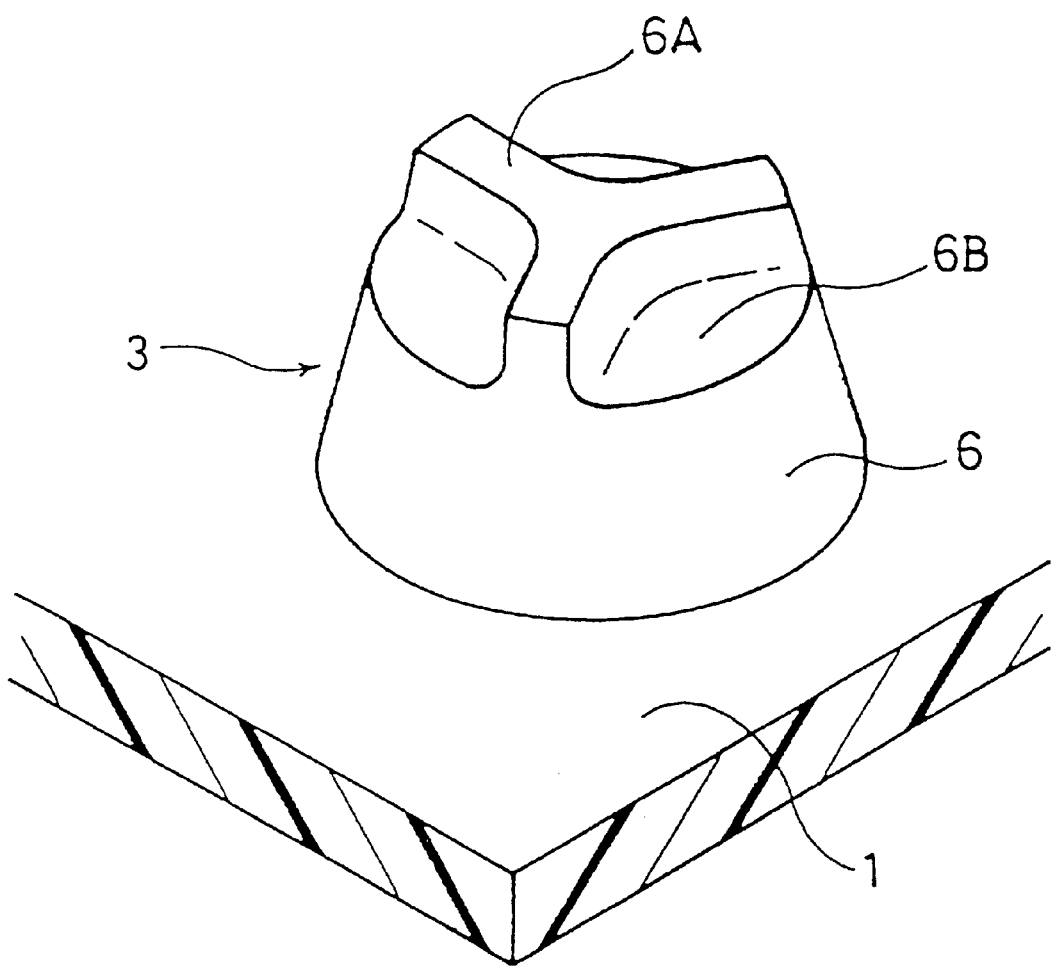
FIG. 21 is a perspective view of a conductive member according to yet another embodiment of the invention.

In FIG. 21, the first contact face 6A extends in radial directions, with the remaining area made as the second contact face 6B.

Figure 22:
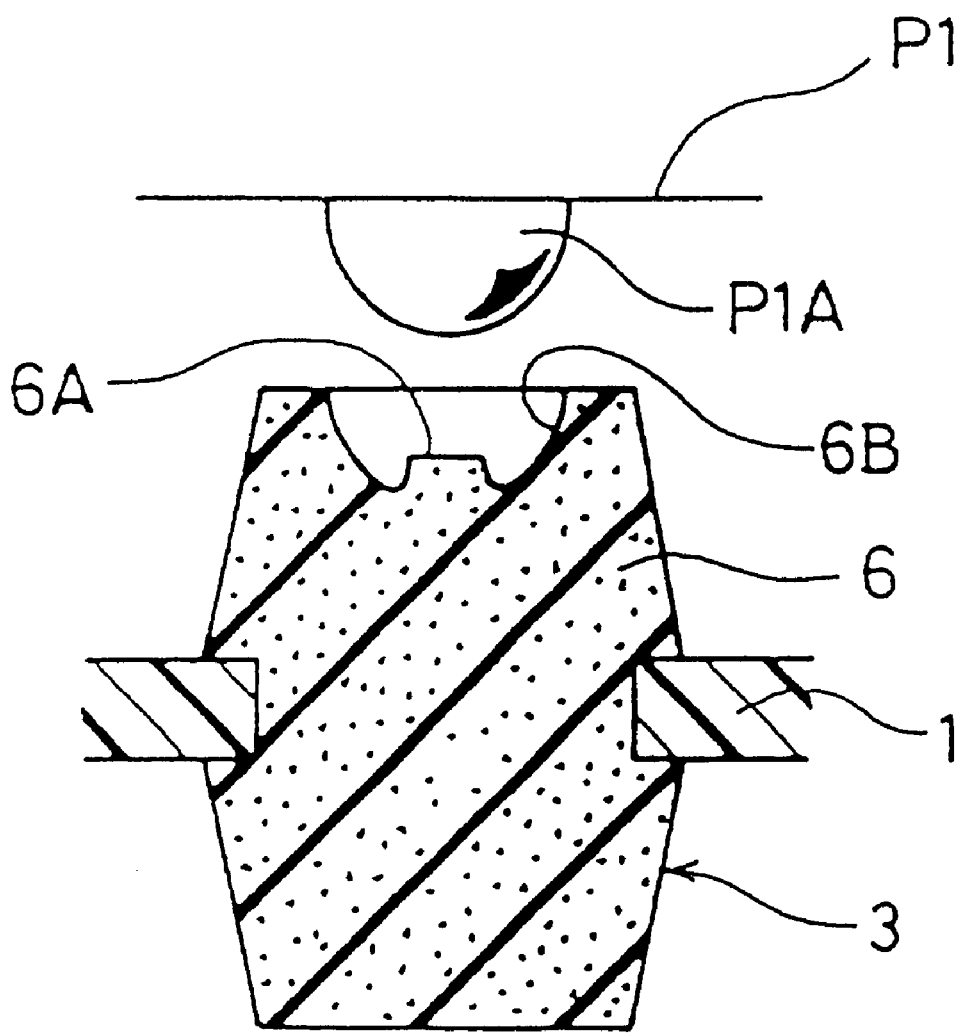
FIG. 22 is a sectional view of a conductive member according to another embodiment of the invention.

In FIG. 22, where the circuit portion P1A of a connection object P1 is hemispheric, it is preferred that the second contact face 6B has a concave surface to match the hemispheric circuit portion P1A while the first contact face 6A is flat.

Figure 23:
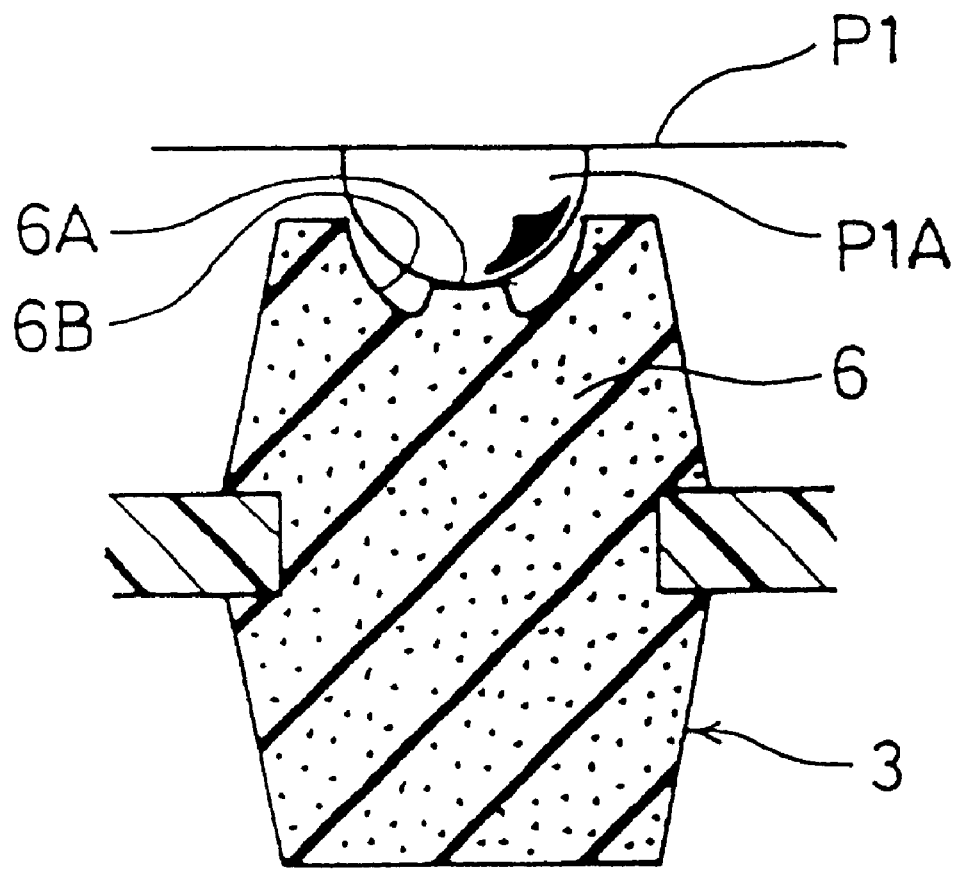
FIG. 23 is a sectional view of the conductive member of FIG. 22, wherein it is being contacted.
Figure 24:
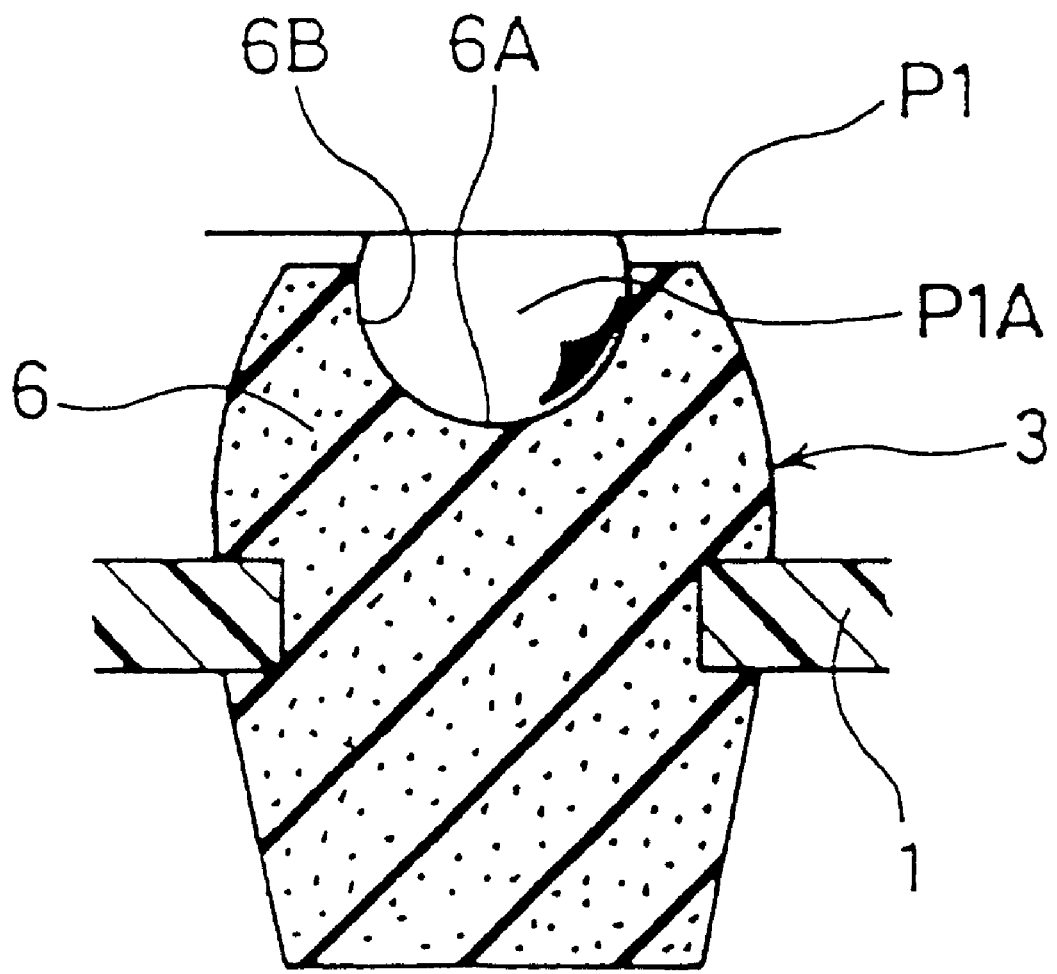
FIG. 24 is a sectional view of the conductive member of FIG. 22, wherein it has been contacted.

In FIG. 23, the circuit portion P1A of a connection object P1 first makes contact with the first contact face 6A and the second contact face 6B as shown in FIG. 24.

Figure 25:
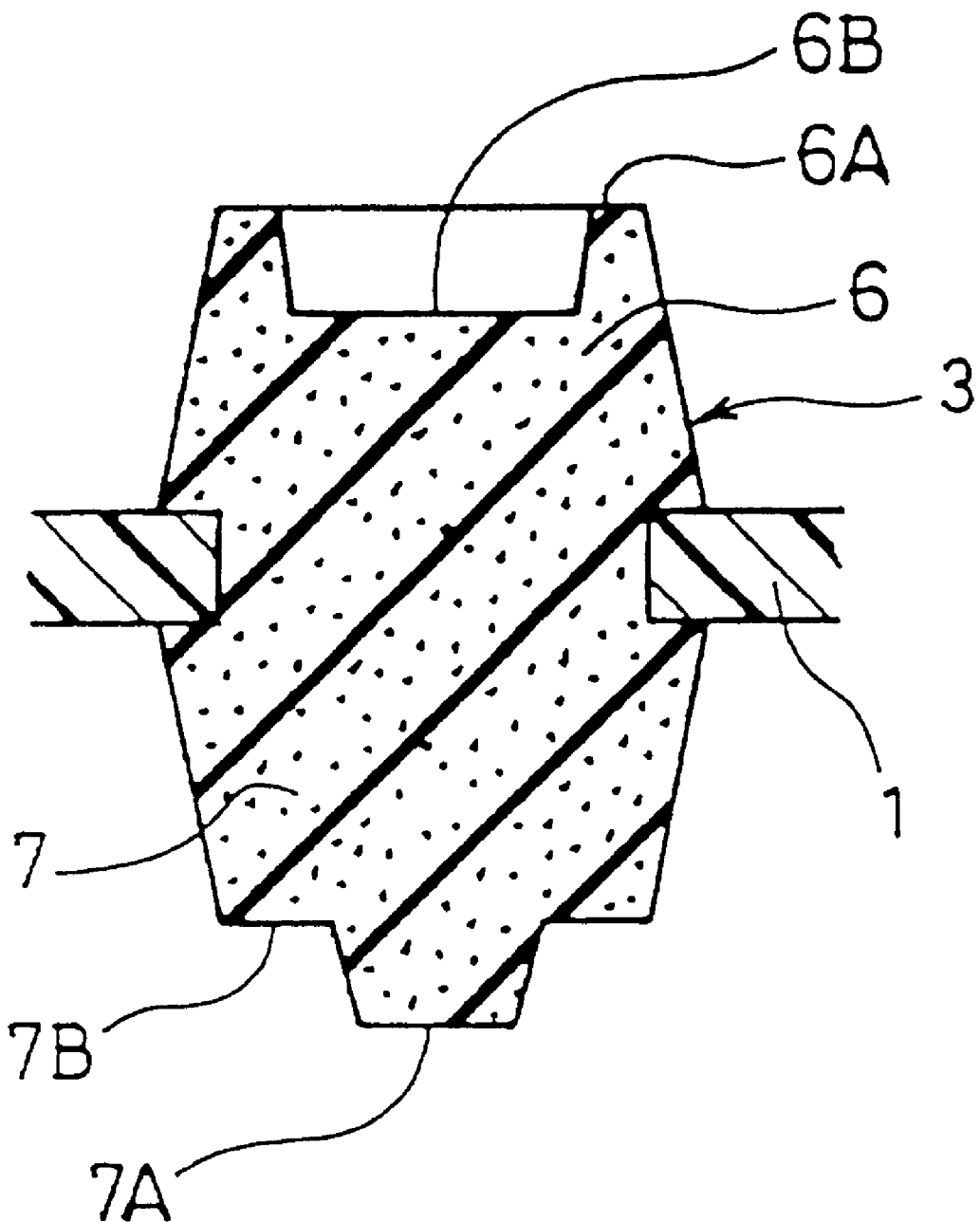
FIG. 25 is a sectional view of a conductive member according to still another embodiment of the invention.

In FIG. 25, the upper protruded section 6 has the same structure as that of FIG. 19 while the lower protruded section 7 has the same structure as that of FIG. 18. At the initial compression stage, the amount of compression of the first contact face 7A is absorbed by the concave second contact face 6B because the first contact face 7A is situated at a position corresponding to the concave second contact face 6B so that the conductor member 3 as a whole is not compressed very much. That is, a small force to compress is able to provide the above displacement of the first contact face 7A.

Figure 26:
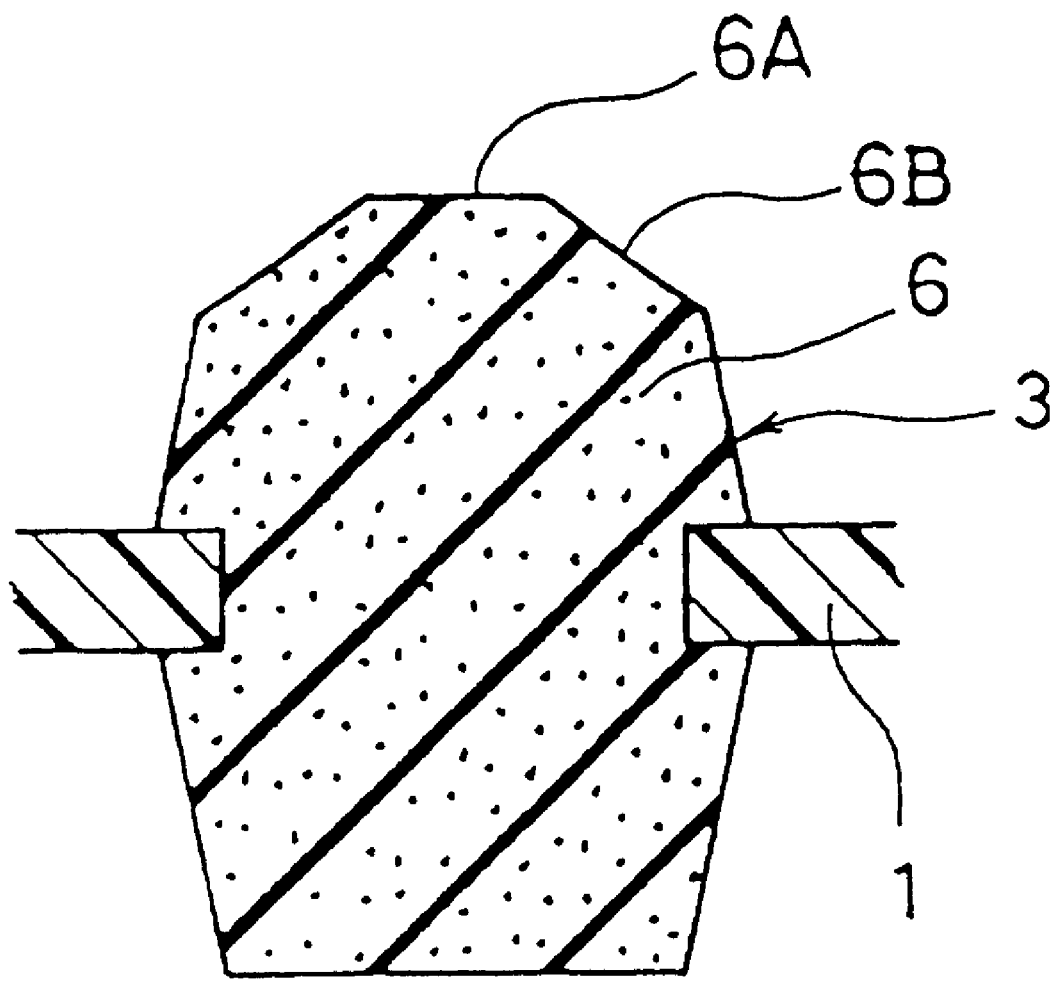
FIG. 26 is a sectional view of a conductive member according to yet another embodiment of the invention.

In FIG. 26, where the circuit portion of a connection object is flat, the first contact face 6A is flat and parallel to the support plate 1 while the second contact face 6B is sloped. Both of the contact faces 6A and 6B make successive contacts with the circuit portion to produce the effects described above according to the invention. Alternatively, the sloped face may be curved.

The above two stepped contact faces with the circuit portion of a connection object may be three or more stepped contacts. The various contact faces may be provided on both or either of the upper and lower protruded sections.

Figure 27:
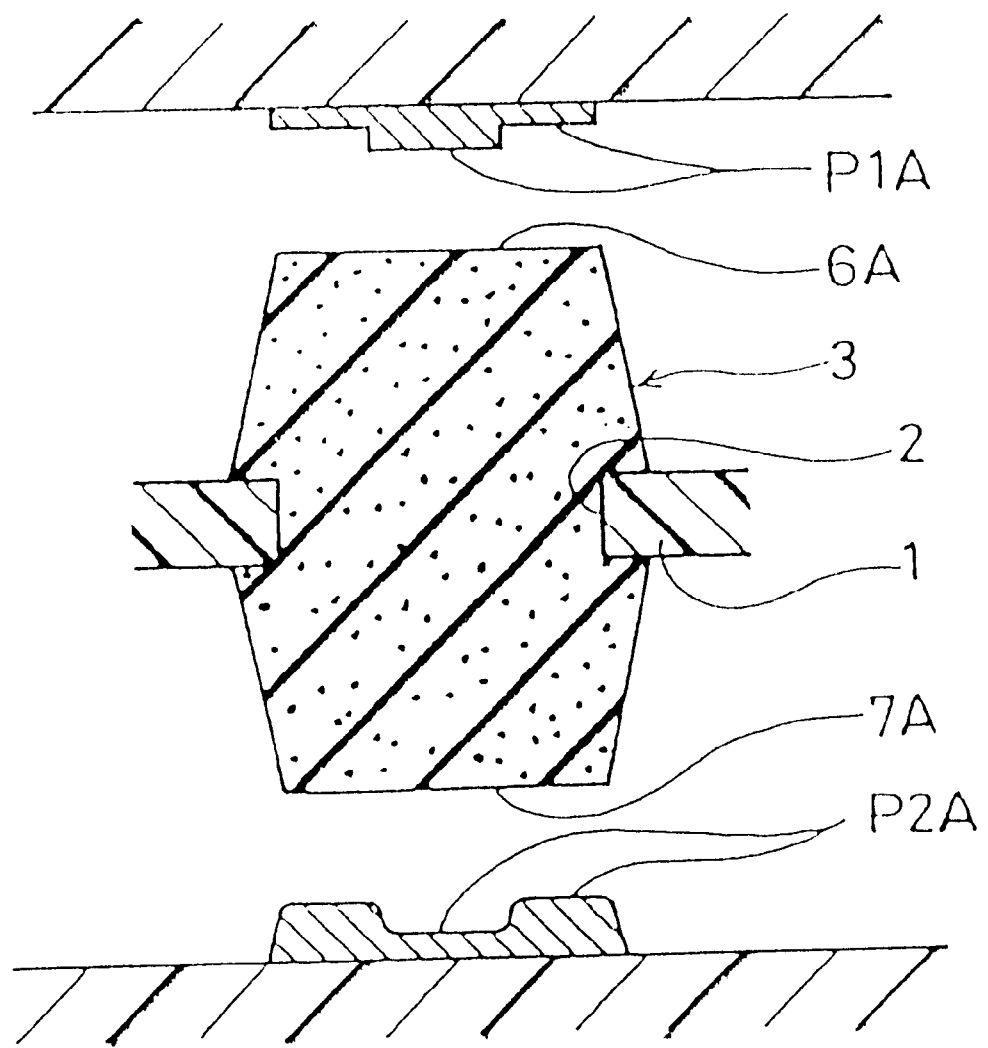
FIG. 27 is a sectional view of a conductive member according to another embodiment of the invention.

In FIG. 27, the conductive member 3 has upper and lower flat contact faces 6A and 6B while the upper and lower circuit portions P1A and P2A of connection objects P1 and P2 have raised and indented areas, respectively, so that the conductive member 3 is compressed in stepped manner to produce the same effects as described above. It is sufficient that the circuit portion of either upper or lower contact object is provided with either raised or indented configuration.

Figure 28:
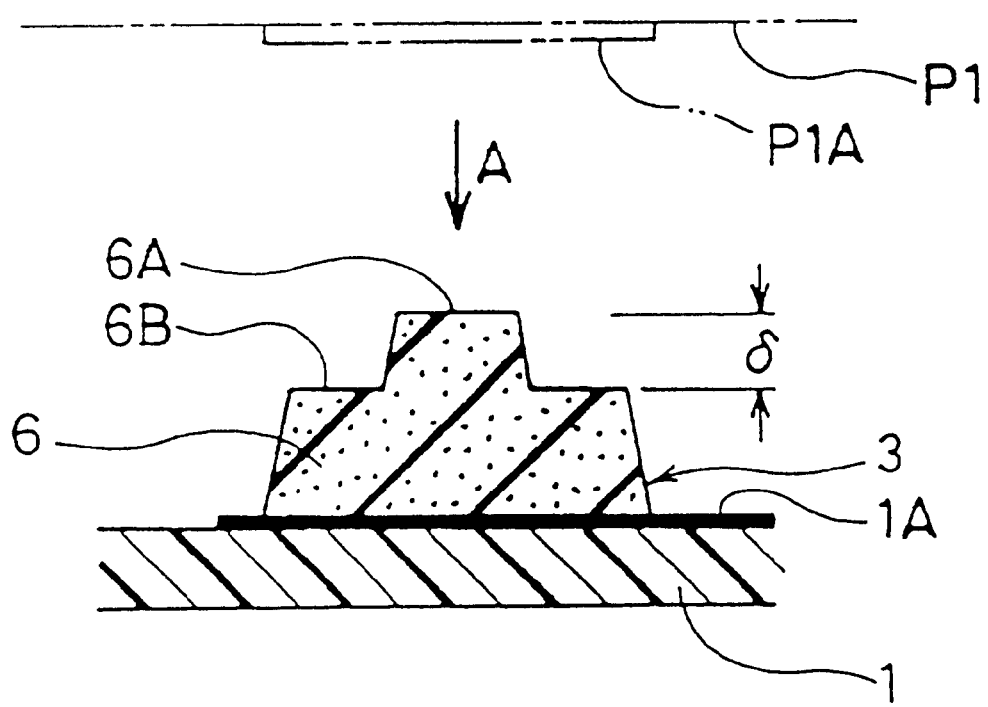
FIG. 28 is a sectional view of a conductive member according to still another embodiment of the invention.

In FIG. 28, the conductive member 3, which has a configuration similar to the upper half of the conductive member 3 of FIG. 18, is provided on a circuit portion 1A of the support member 1. It makes successive contacts with the circuit portion P1A of a connection object P1 in the same manner as the conductive member of FIG. 18. Such a conductive member as this may be applied to any of the connection methods described in FIGS. 18 through 28.

As has been described above, according to still another aspect of the invention, a plurality of contact faces are provided so that the contact area increases in stepped manner as the conductive member is compressed. Consequently, not only the increase in electrical resistance with the increase in compression is prevented but also large amounts of displacement of the contact faces are assured so that variations in distance between the conductive members and the connection objects are absorbed and the contacts are so stable that the electrical characteristics are improved.

What is claimed is:

1. An intermediate electrical connector comprising:
    a support plate which is made of a dielectric material and has at least one support aperture having an inside diameter; and
    at least one conductive member provided through said support aperture to short-circuit circuit portions of connection objects; said conductive member being made of a conductive elastomer and comprising:
        a retention section with flange portions for engaging with a top surface and a bottom surface of said support aperture to attach said conductive member to said support plate;
        an elastic protruded section extending from said retention section in a direction of thickness of said support plate to form at opposite ends contact faces for elastic contact with said circuit portions of said connection objects and having adjacent to said retention section shoulder portions, wherein an outside diameter of said elastic protruded section in the proximity of said shoulder portions is smaller than said inside diameter of said support aperture, thus situating said elastic protruded section within a radial range of said support aperture.

2. An intermediate electrical connector according to claim 1, wherein said protruded section has a cylindrical surface.

3. An intermediate electrical connector according to claim 1, wherein said protruded section has a conic surface.

4. An intermediate electrical connector according to claim 1, wherein said conductive member has a longitudinal section which is asymmetric relative to an axis of said conductive member.

5. An intermediate electrical connector according to claim 4, wherein said longitudinal section of said conductive member changes in a circumferential direction.

6. An intermediate electrical connector according to claim 4, wherein said contact faces each have a tilted surface.

7. An intermediate electrical connector according to claim 1, wherein said conductive member has a longitudinal section which is symmetric relative to an axis of said conductive member.

8. An intermediate electrical connector according to claim 7, wherein said contact faces each have a flat surface at right angles to said axis.

9. An intermediate electrical connector according to claim 7, wherein said contact faces each have a convex or concave surface.

10. An intermediate electrical connector comprising:
   a support plate which is made of a dielectric material and has at least one support aperture; and
   at least one conductive member provided through said support aperture to short-circuit circuit portions of connection objects; said conductive member being made of a conductive elastomer and comprising:
      a retention section for engage with said support aperture to attach said conductive member to said support plate; and
      an elastic protruded section extending from said retention section in a direction of thickness of said support plate to form at opposite ends a pair of bearing faces for elastic contact with said circuit portions of said connection objects; and
      a displacement recess formed on one end of the protruded section for allowing said elastic protruded section to undergo elastic displacement.

11. An intermediate electrical connector according to claim 10, wherein said displacement recess is provided between a face opposite to said bearing face and one of said connection objects.

12. An intermediate electrical connector according to claim 10, wherein said displacement recess is a cavity provided within said conductive member.

13. An intermediate electrical connector according to claim 10, wherein said retention section of said conductive member is held by a circumferential edge of said support aperture.

14. An intermediate electrical connector according to claims 10, wherein said conductive member is held by a bridge portion extending across said support aperture.

15. An intermediate electrical connector comprising:
   a support plate made of a dielectric material so as to have a support aperture;
   a conductive member supported by said support plate and made of a conductive elastomer so as to have at opposite ends a pair of contact faces for contact with a pair of connection objects provided on opposite sides of said support plate to short-circuit circuit portions of said connection objects, wherein at least one of said contact faces has at least first and second contact sections which are formed in different planes so as to successively make elastic contacts with one of said circuit portions of said connection objects.

16. An intermediate electrical connector according to claim 15, wherein said first contact section is provided at a center of said contact face while said second contact section is provided around said first contact section.

17. An intermediate electrical connector according to claim 15, wherein said first contact section is substantially parallel to said circuit portion of said connection object while said second contact section is provided closer to said support plate than said first contact section.

18. An intermediate electrical connector according to claim 17, wherein said first contact section is provided at a periphery of said contact face while said second contact section is provided at a center of said contact face.

19. An intermediate electrical connector according to claim 17, wherein said first contact section is provided at a portion of periphery while said second contact section is provided adjacent to said first contact section.

20. An intermediate electrical connector according to claim 17, wherein said first contact section extends radially on said contact face while said second contact section is provided at a remaining area of said contact face.

21. An intermediate electrical connector according to claim 17, wherein said contact face has a generally concave surface to match a convex surface of said circuit portion of said connection object, said concave surface having a raised portion to form said first contact section and a remaining portion to form said second contact section.

22. An intermediate electrical connector according to claim 17, wherein said first contact section is parallel to said circuit portion of said connection object while said second contact section is tilted with respect to said first contact section.

23. An electrical connection system comprising:
   a support plate made of a dielectric material so as to have a support aperture;
   a conductive member supported by said support plate and made of a conductive elastomer so as to have at opposite ends a pair of contact faces for contact with circuit portions of a pair of connection objects provided on opposite sides of said support plate to short-circuit said circuit portions; wherein at least one of said contact faces has at least first and second contact sections which are formed in different planes so as to successively make elastic contacts with one of said circuit portions.

24. An electrical connection system comprising:
   a support plate made of a dielectric material,
   an electric circuit provided on one face of said support plate;
   a conductive member provided on said electric circuit and made of a conductive elastomer so as to have at an end opposite to said electric circuit a contact face with at least first and second contact sections which successively make elastic contacts with a circuit portion of a connection object to short-circuit said electric circuit to said circuit portion of said connection object, wherein the at least first and second contact sections are formed in different planes.

* * * * *